United States Patent [19]
Nanda et al.

[11] Patent Number: 5,390,190
[45] Date of Patent: Feb. 14, 1995

[54] INTER-DOMAIN LATCH FOR SCAN BASED DESIGN

[75] Inventors: Sunil Nanda, Los Altos; Rajiv N. Patel, San Jose, both of Calif.

[73] Assignee: Sun Microsystems, Inc., Mountain View, Calif.

[21] Appl. No.: 890,690

[22] Filed: May 29, 1992

[51] Int. Cl.$^6$ .............................................. H04B 17/00
[52] U.S. Cl. .................... 371/22.3; 327/141; 327/291; 327/199; 326/93
[58] Field of Search ............... 371/22.3; 307/440, 453, 307/480, 482.1, 269, 272.1–272.3, 601, 358, 465

[56] References Cited

U.S. PATENT DOCUMENTS

5,252,917 10/1993 Kadowahi ........................... 307/480
5,281,864 1/1994 Hahn et al. ....................... 307/272.2

Primary Examiner—Emanuel T. Voeltz
Assistant Examiner—Hal D. Wachsman
Attorney, Agent, or Firm—Blakely Sokoloff Taylor & Zafman

[57] ABSTRACT

In a sequential logic design having two domains, each having opposing clock edge for its flip-flops, an inter-domain latch is provided for establishing a controllable and observable boundary point for the two domains. The inter-domain latch comprises three multiplexors and three latches. The first multiplexor, the first latch, the second multiplexor, the second latch, the third latch and the third multiplexor are coupled serially. Additionally, the output of the first latch is by-passed to the third multiplexor. The latches either open when the clock pulse is low or when the clock pulse is high. The first and third latches are driven by the same clock pulses, and the second latch is driven by an inverted clock pulse. Scan vectors for the first and second domains are scanned in through the first and second multiplexors respectively. The outputs of the first and second domains are observed at the second latch and the third multiplexor respectively.

6 Claims, 8 Drawing Sheets

LEGEND
D1 = DOMAIN ONE
D2 = DOMAIN TWO
FF = RISING EDGE FLIP-FLOP
ff = FALLING EDGE FLIP-FLOP
Ll = LATCH OPEN AT CLOCK LOW
Lh = LATCH OPEN AT CLOCK HIGH
LG1 = LOGIC ONE
LG2 = LOGIC TWO

FIGURE 3b
(PRIOR ART)

| LEGEND |
|---|
| D1 = DOMAIN ONE |
| D2 = DOMAIN TWO |
| FF = RISING EDGE FLIP-FLOP |
| ff = FALLING EDGE FLIP-FLOP |
| Ll = LATCH OPEN AT CLOCK LOW |
| Lh = LATCH OPEN AT CLOCK HIGH |
| LG1 = LOGIC ONE |
| LG2 = LOGIC TWO |

INTER-DOMAIN LATCH FOR SCAN BASED DESIGN

BACKGROUND OF THE INVENTION

1. Field of the Invention

The present invention relates to the fields of Logic Design, Design for Testability and Scan Based Design. More specifically, the present invention is an inter-domain latch, which has particular application to implementing scan based design for multiple clock edge digital logic.

2. Background

Today, many digital logic designs incorporate some forms of scan based design for testability. Scan based designs can be classified as full serial integrated scan, isolated serial scan, or non-serial scan. The various forms of scan based design differs in the employment of shift register, and if used, its composition, and whether it is part of the normal data path.

However, the various forms of scan based design are all used for the purpose of increasing the controllability and observability of the logic design. Controllability is the ability to establish a specific signal at each node in the logic design by setting values on the logic's input. Observability is the ability to determine the signal value at any node in the logic design by controlling the logic's input and observing its output.

As a result of enhanced controllability and/or observability, higher fault coverage of the logic design can be achieved. Fault coverage is the ratio between the number of faults detectable and the total number of faults in the assumed fault universe. Thus, controllability and observability are the key measures of testability. The goal is to achieve 100% controllability and 100% observability if possible.

When applying scan based design principles to sequential logic designs, all storage elements (flip-flops) are made scannable, and have a common clock applied to them. As a result, the entire sequential logic design is transformed into a combinatorial logic design, thereby allowing test patterns to be easily generated for the sequential logic design. For further information, see E.G. McCluskey, *Logic Design Principles,* Prentice Hall, 1986.

However, for more complex logic designs, sometimes it becomes necessary to use flip-flops clocked with two clocks, one being the complement of the other. In other words, the logic design includes rising edge as well as falling edge flip-flops. In order to implement scan based design for these more complex logic designs, typically the logic design is partitioned into a number of domains (also known as partitions), with each domain being affected by either the rising or the falling clock edge, and additional logics are placed on the boundaries connecting the various domains. Each domain is then treated as a separate independent scannable entity for testing.

The only issue remains to be resolved is how to handle the signal interface between two domains. A signal entering from one domain to another domain having opposite edge clocks for their flip-flops is an unobservable signal for the originating domain and an uncontrollable signal for the receiving domain. The interface signals between two domains having opposite edge clocks for their flip-flops are categorized in FIGS. 1a–1b.

Figure 1A:
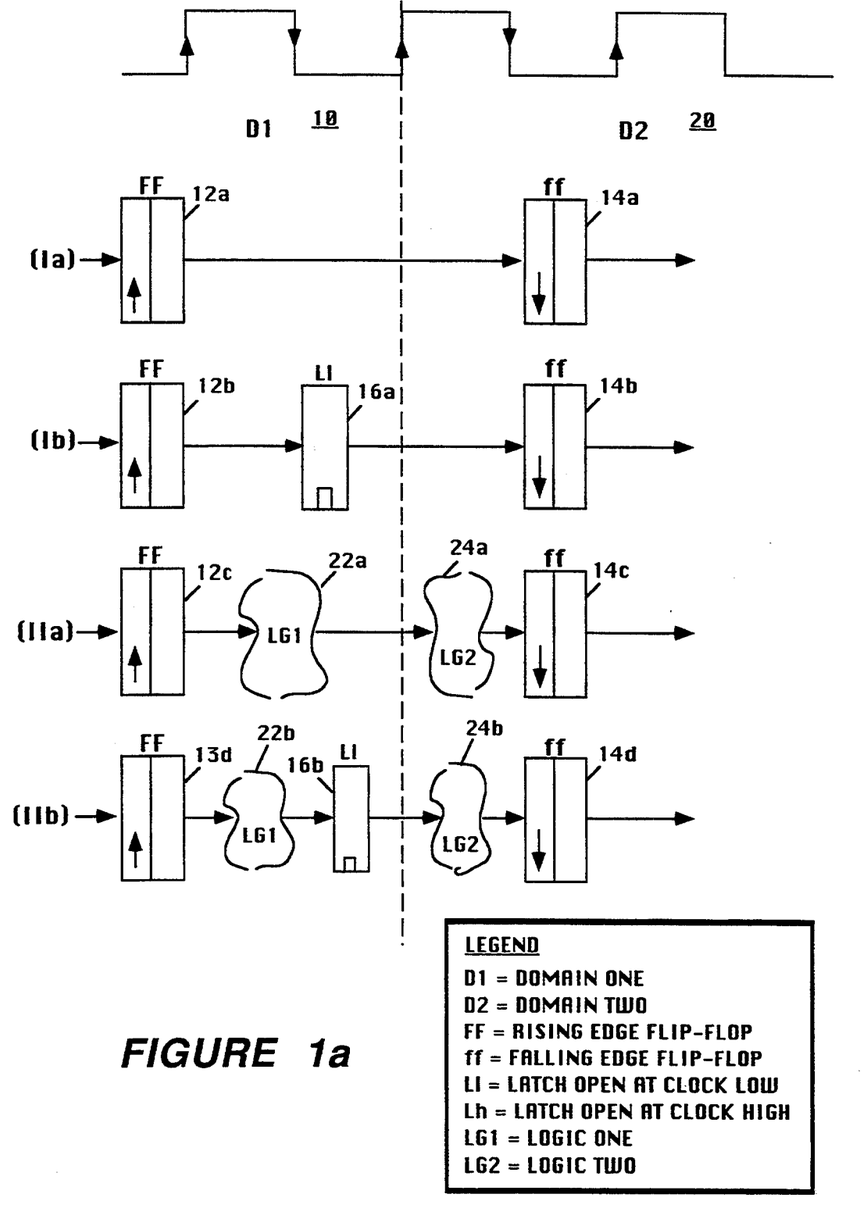
FIGS. 1a–1b illustrate the eight cases where an interface signal is going between two domains of a sequential logic design with opposite edge clocks for their flip-flops.
Figure 1B:
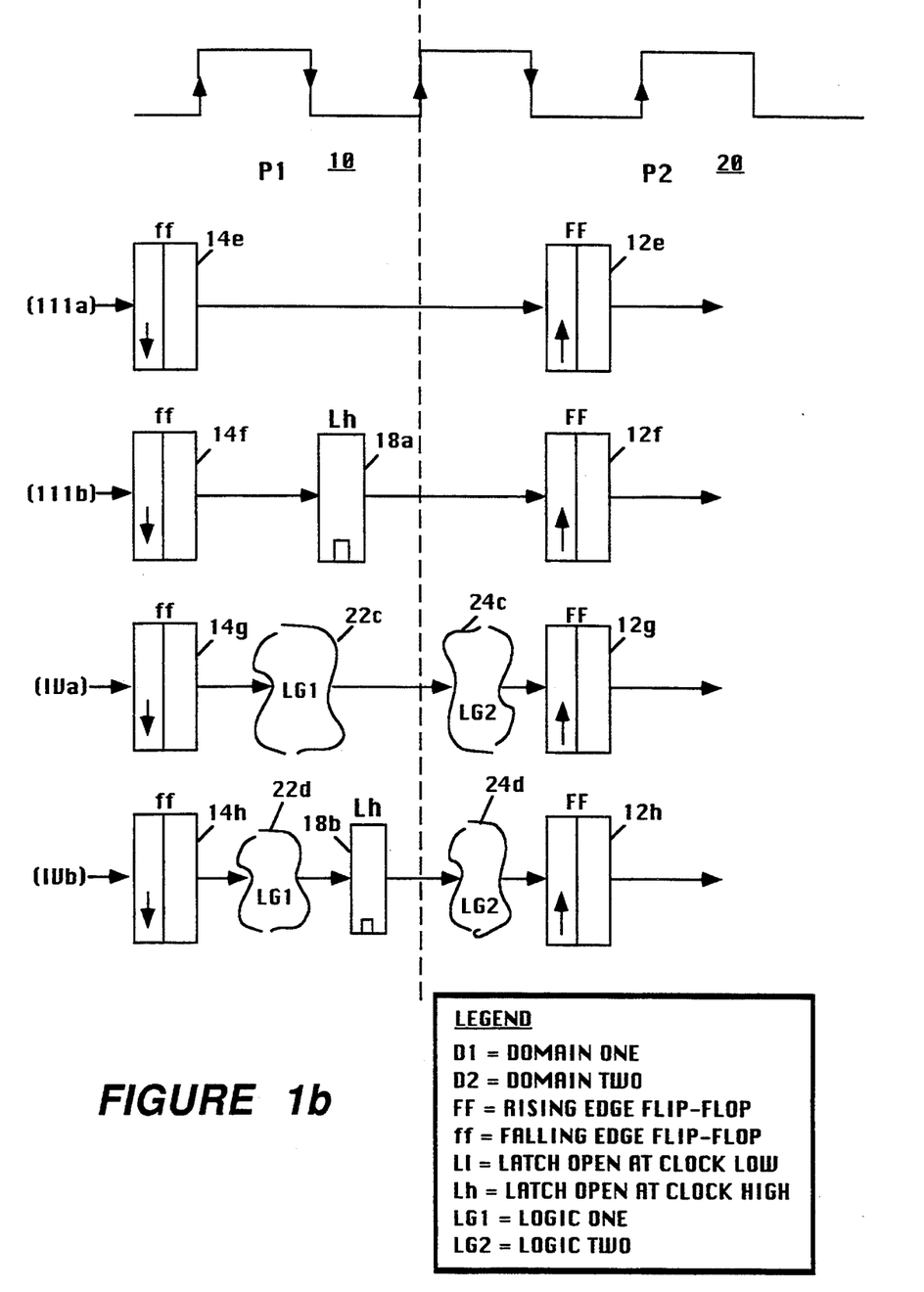

FIG. 1a illustrates the four cases where the signal goes from a rising edge domain to a falling edge domain, and FIG. 1b illustrates the four cases where the signal goes from a falling edge domain to a rising edge domain. With each group of four cases, there are two cases where intervening logics are not involved, cases Ia and Ib of FIG. 1a, or cases IIIa and IIIb of FIG. 1b, and there are two cases where intervening logics are involved, cases IIa and IIb of FIG. 1a, or cases IVa and IVb of FIG. 1b. With each group of two cases, there is a first case where an intervening latch is not involved, cases Ia or IIa of FIG. 1a, or cases IIIa or IVa of FIG. 1b, and there is a second case where an intervening latch is involved, cases Ib or IIb of FIG. 1a, or cases IIIb or IVb of FIG. 1b.

Figure 2A:
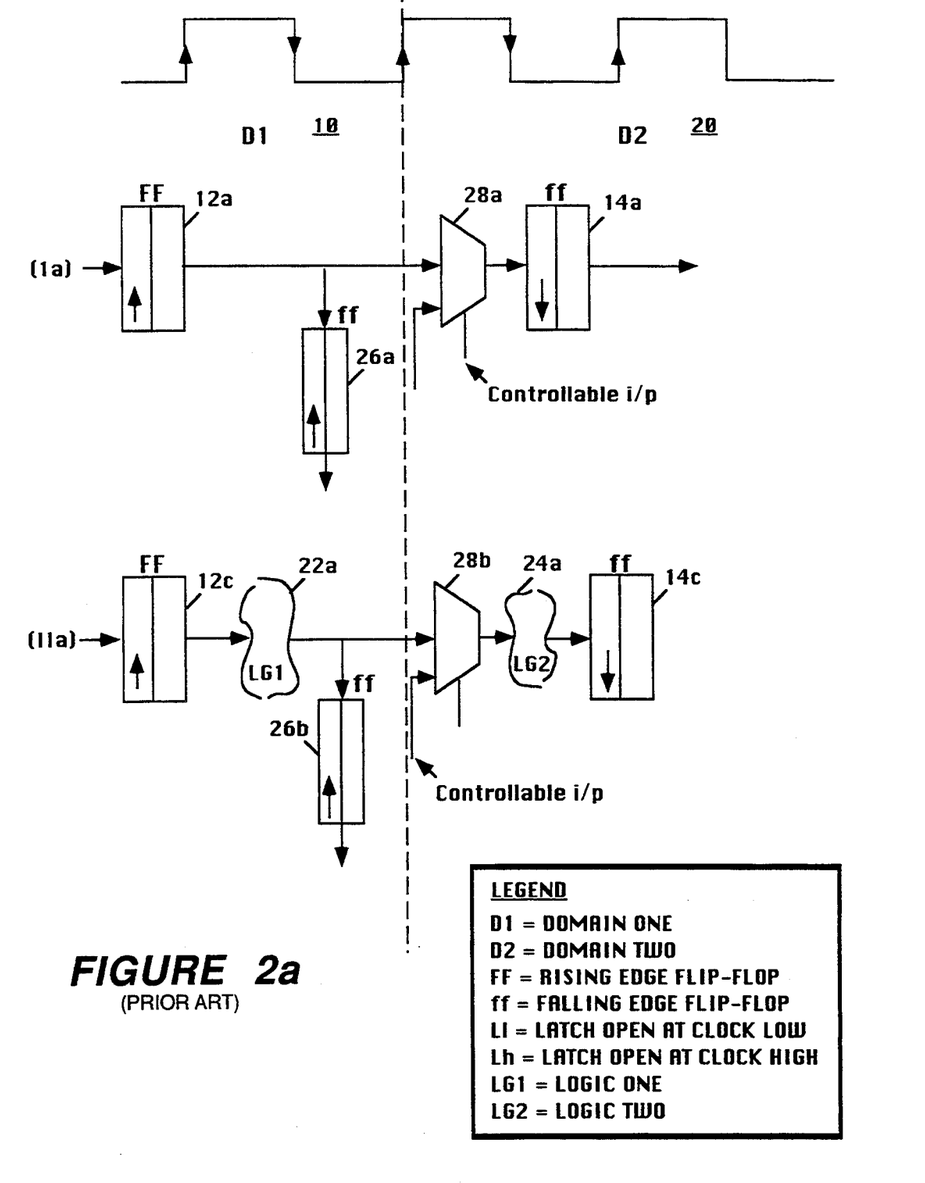
FIGS. 2a–2b illustrate the prior art approach for establishing a controllable and observable boundary point between the two domains for four of the eight cases illustrated in FIGS. 1a–1b.
Figure 2B:
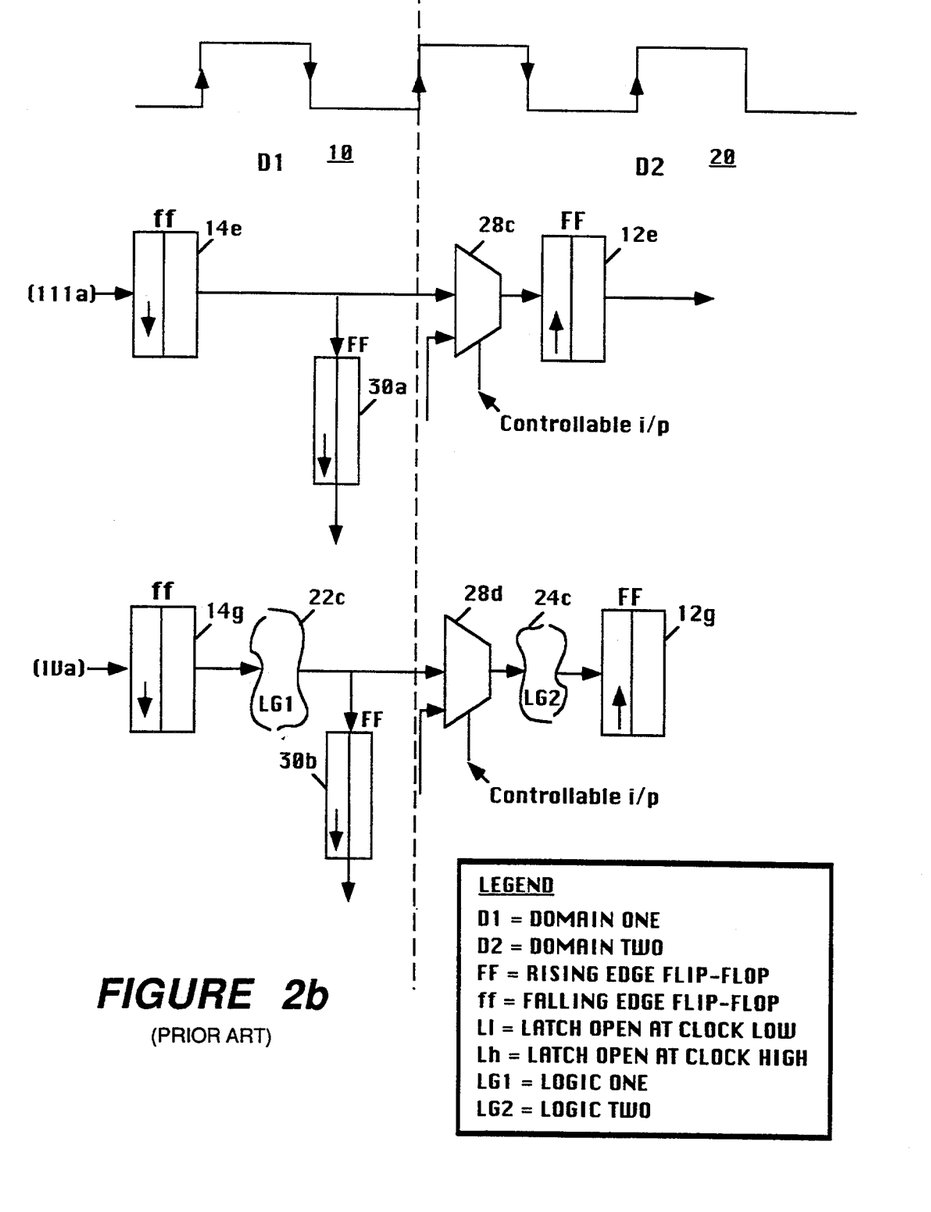

FIGS. 2a–2b illustrate how a controllable and observable point can be established at the boundary of the two domains for four of the eight cases. FIG. 2a illustrates for cases Ia and IIa of FIG. 1a, and FIG. 2b illustrates for cases IIIa and IVa of FIG. 1b. In each case, the four latches that form the rising edge and falling edge flip-flops, 12a and 14a, 12c and 14c, 12e and 14e, or 12g and 14g, operate in three phases of a common clock, thus, a "redundant" latch exists. Therefore, a controllable and observable point at the boundary of the two domains can easily be established by adding a rising edge flip-flop, 26a or 26b, for cases Ia and IIa, or a falling edge flip-flop, 30a or 30b, for cases IIIa and IVa, in the first domain (D1) 10, and adding a multiplexor, 28a–28d, in the second domain (D2) 20, for each of the four cases. In each case, the added multiplexor, 28a–28d, is coupled to a controllable input. As a result the output signal of domain one (D1) 10 is observable through the added rising edge or falling edge flip-flop, 26a, 26b, 30a, or 30b, and the input signal to domain two (D2) 20 is controllable through the added multiplexor, 28a, 28b, 28c or 28d.

Figure 3A:
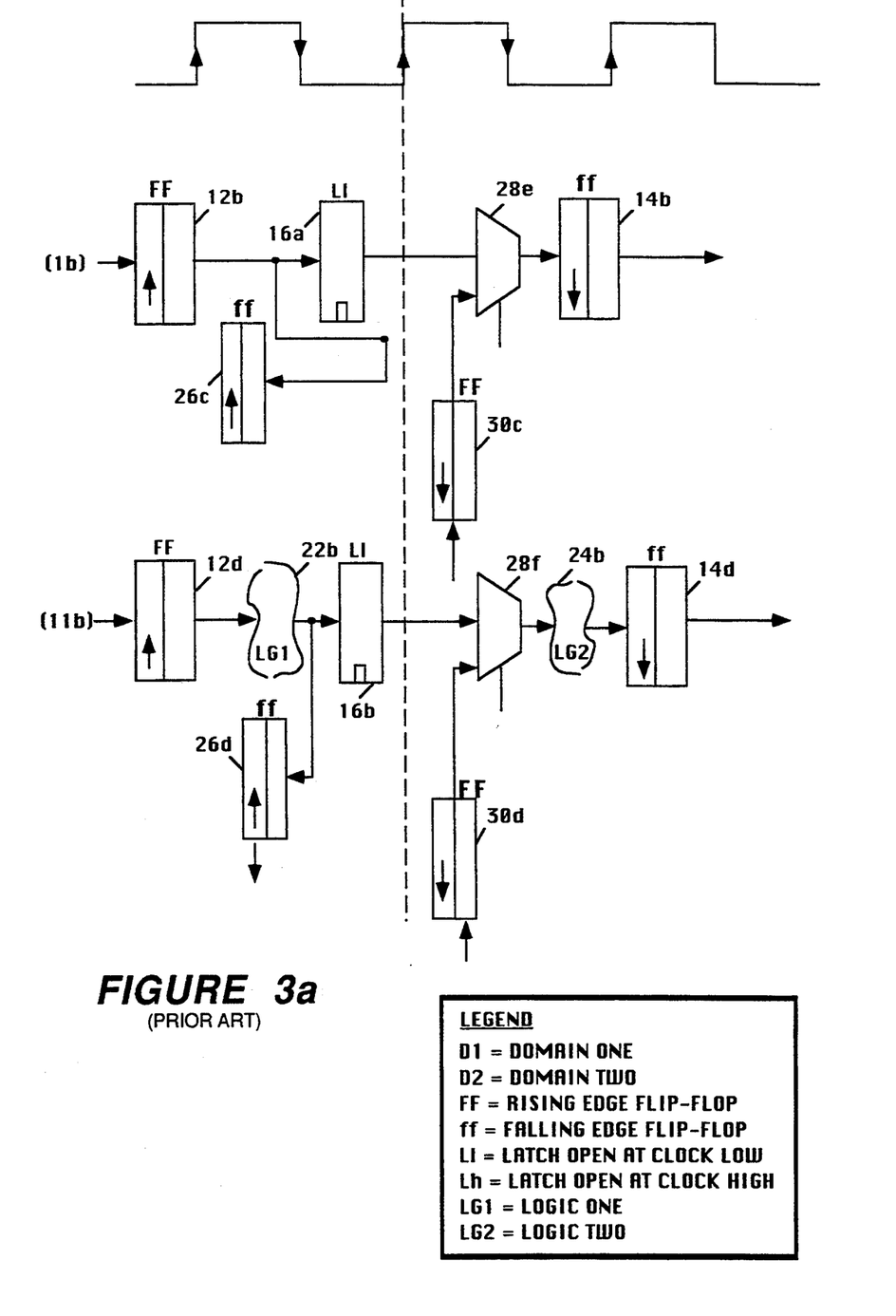
FIGS. 3a–3b illustrate the prior art approach for establishing a controllable and observable boundary point between the two domains for the other four cases illustrated in FIGS. 1a–1b.
Figure 3B:
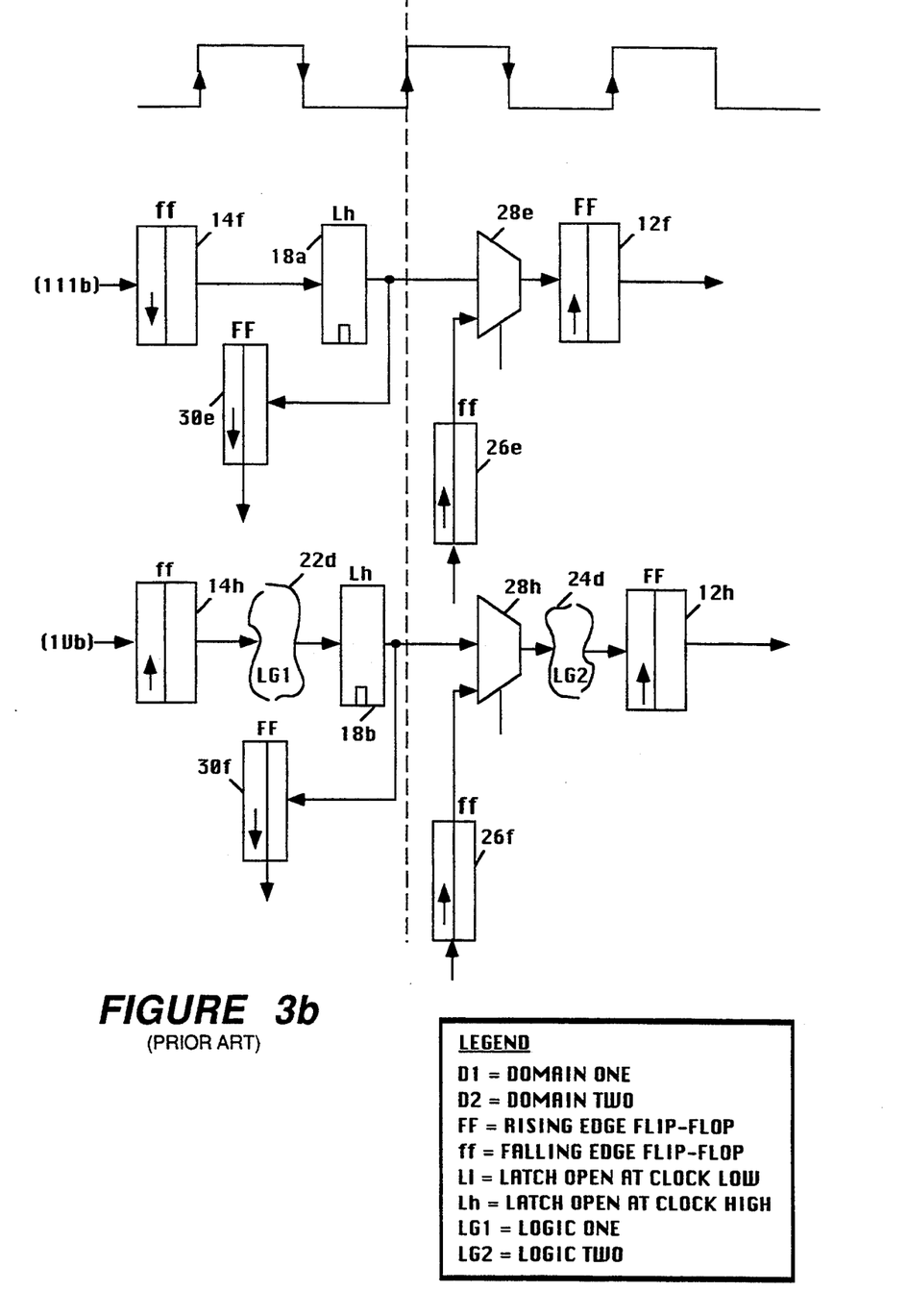

FIGS. 3a–3b illustrate how a controllable and observable point can be established at the boundary of the two domains for the remaining four cases. FIG. 3a illustrates for cases Ib and IIb of FIG. 1a, and FIG. 2b illustrates for cases IIIb and IVb of FIG. 1b. In each case, the four latches that form the rising edge and falling edge flip-flops, 12b and 14b, 12d and 14d, 12f and 14f, or 12h and 14h, are fully utilized, no "redundant" latch exists. Therefore, a controllable and observable point at the boundary of the two domains can not be established as easily as before. However, it can still be established by adding a rising edge flip-flop, 26c or 26d, for cases Ib and IIb, or a falling edge flip-flop, 30e or 30f, for cases IIIb and IVb, in the first domain (D1) 10, and adding a multiplexor, 28e or 28f, and a falling edge flip-flop, 30c or 30d, for cases Ib and IIb, and a multiplexor, 28g or 28h, and a rising edge flip-flop, 26e or 26f, for cases IIIb and IVb, in the second domain (D2) 20. In each case, the added multiplexor, 28e–28h, is coupled to a controllable input through the added falling edge or rising edge flip-flop, 30c, 30d, 26e or 26f. As a result the output signal of domain one (D1) 10 is observable through the added closing edge or falling edge flip-flop, 26c, 26d, 30e, or 30f, and the input signal to domain two (D2) 20 is controllable through the added multiplexor, 28e, 28f, 28g or 28h, and its corresponding falling edge or rising edge flip-flop, 30c, 30d, 26e or 26f.

Thus, for cases Ib, IIb of FIG. 1a, and cases IIIb and IVb of FIG. 1b, one rising edge flip-flop, one falling edge flip-flop and one multiplexor are additionally required to establish a controllable and observable boundary point between the two domains where only a functional latch exists. To have all functional latches in the designs illustrated in cases Ib and IIb of FIG. 1a and cases IIIb and IVb of FIG. 1b replaced by a latch, two additional flip-flops and a multiplexor is a large increase in hardware requirement.

Therefore, it is desirable to provide a method and apparatus for establishing a controllable and observable boundary point between two domains with reduced amount of hardware requirements. As will be disclosed, this object and desired result are among the objects and desired results of the present invention, which provides an inter-domain latch having relatively low hardware requirement, that can be used to establish a controllable and observable boundary point between two domains with opposite edge clocks for their flip flops.

SUMMARY OF THE INVENTION

An inter-domain latch for scan based design is disclosed. The interdomain latch of the present invention has particular application to implementing scan based design for sequential logic design with rising edge and falling edge flip-flops. The inter-domain latch can be used to replace an intervening latch between two partitioned domains of the sequential logic design with opposing edge clocks for their flip-flops, and establish a controllable and observable boundary point between the two domains.

The inter-domain latch comprises three latches and three multiplexors. The first multiplexor, the first latch, the second multiplexor, the second latch, the third latch and the third multiplexor are serially coupled together. Additionally, the output of the first latch is by-passed to the third multiplexor. The scan vectors for the first and second domain are scanned in through the first and second multiplexors respectively. The output of the first and second domains are observed at the second latch and the third multiplexor respectively.

For the case where the interface signal is going from a rising edge domain to a falling edge domain, the first and third latches open when the clock signal is low and the second latch opens when the clock signal is high. For the case where the interface signal is going from a falling edge domain to a rising edge domain, the first and third latches open when the clock signal is high and the second latch opens when the clock signal is low.

The inter-domain latch of the present invention provides savings of one flip-flop per boundary point. It can be employed as a direct replacement of the intervening latch between the two domains allowing easy implementation.

BRIEF DESCRIPTION OF THE DRAWINGS

The objects, features, and advantages of the present invention will be apparent from the following detailed description of the preferred embodiment of the invention with references to the drawings in which.

DETAILED DESCRIPTION PRESENTLY PREFERRED AND ALTERNATE EMBODIMENTS

An inter-domain latch for scan based design is disclosed. The interdomain latch of the present invention has particular application to implementing scan based design for sequential logic design with rising edge and falling edge flip-flops. The inter-domain latch can be used to replace an intervening latch between two partitioned domains of the sequential logic design with opposing edge clocks for their flip-flops, and establish a controllable and observable boundary point between the two domains.

In the following description for purposes of explanation, specific numbers, materials and configurations are set forth in order to provide a thorough understanding of the present invention. However, it will be apparent to one skilled in the art that the present invention maybe practiced without the specific details. In other instances, well known systems are shown in diagrammatical or block diagram form in order not to obscure the present invention unnecessarily.

Figure 4A:
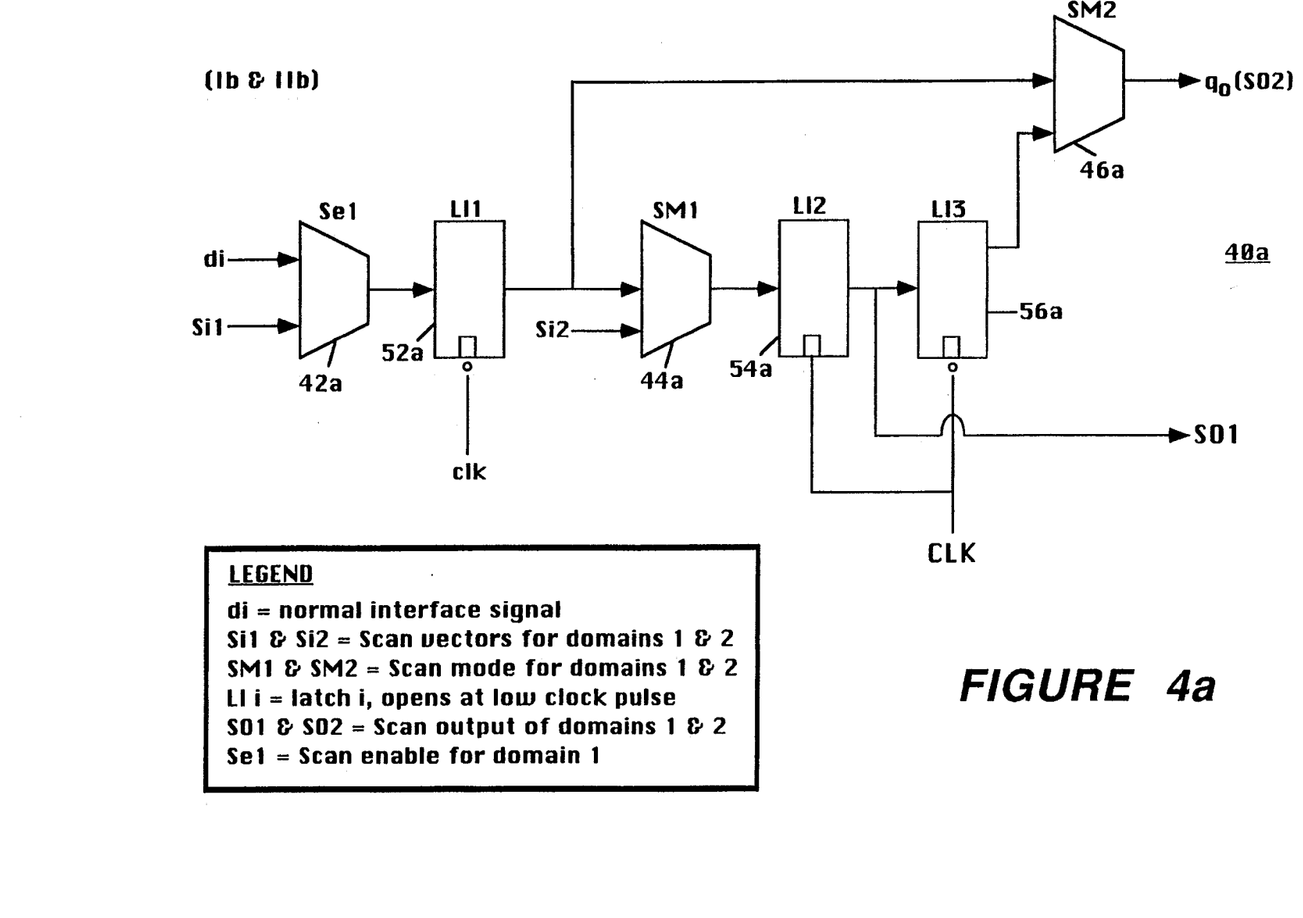
FIGS. 4a–4b illustrate two embodiments of the inter-domain latch of the present invention for establishing a controllable and observable boundary point between the two domains for the cases illustrated in FIGS. 3a–3b.
Figure 4B:
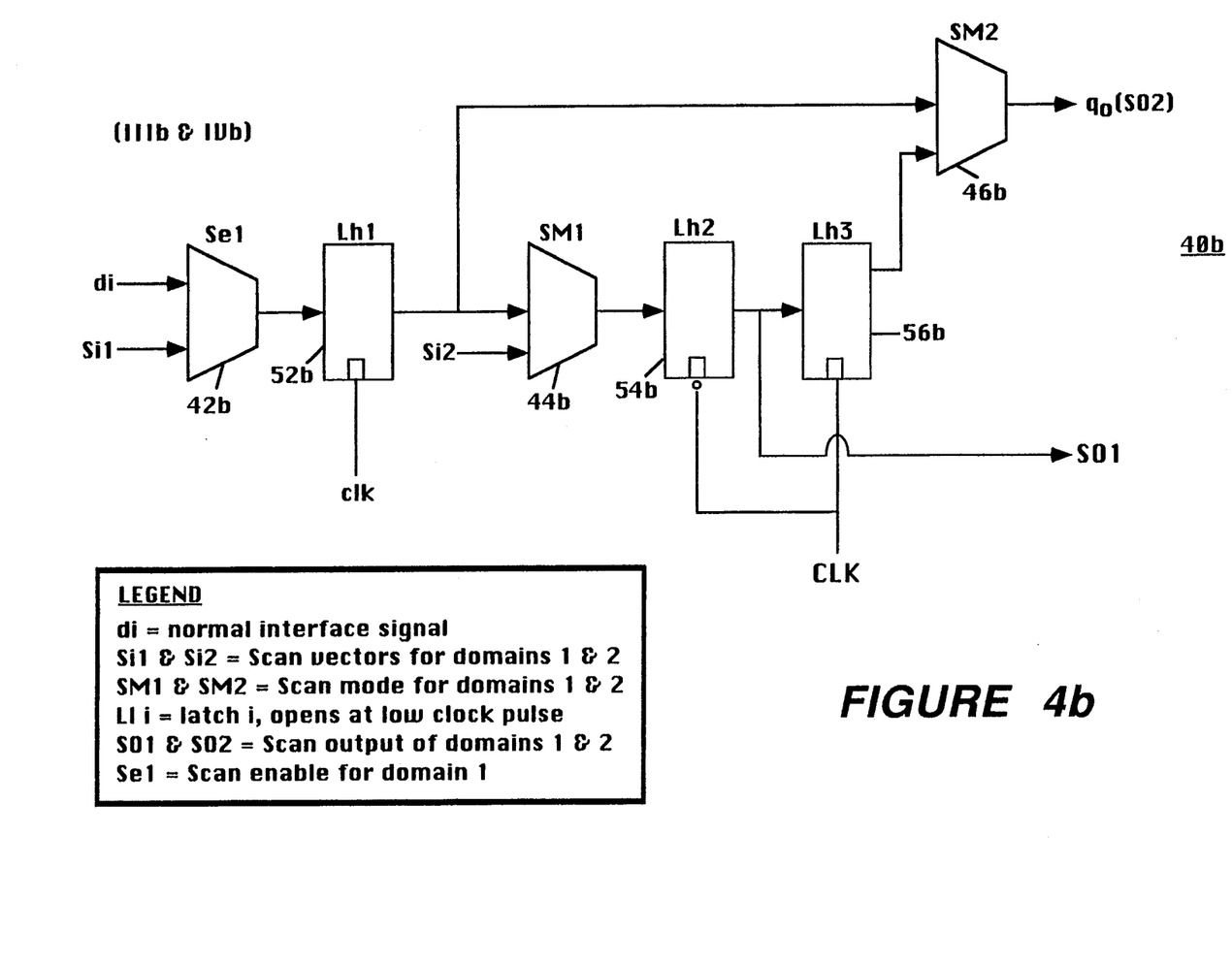

Referring now to FIGS. 4a–4b, two embodiments of the interdomain latch of the present invention for the four cases illustrated in FIGS. 3a–3b are shown. FIG. 4a illustrates the embodiment for cases Ib and IIb illustrated in FIG. 3a, and FIG. 4b illustrate the embodiment for cases IIIb and IVb illustrated in FIG. 3b. In each case, the inter-domain latch, 40a or 40b, replaces the intervening latch between the two domains with opposite edge clocks for their flip-flops.

The inter-domain latch of the present invention, 40a or 40b, comprises three multiplexors, 42a–46a or 42b–46b, and three latches, 52a–56a or 52b–56b. The first multiplexor, 42a or 42b, the first latch, 52a or 52b, the second multiplexor, 44a or 44b, the second latch 54a or 54b, the third latch, 56a or 56b, and the third multiplexor, 46a or 46b, are coupled serially together. Additionally, the output of first latch, 52a or 52b, is by-passed to the third multiplexor, 46a or 46b.

The scan vectors for the first and second domain (si1 and si2) are scanned in through the first multiplexor, 42a or 42b, and the second multiplexor, 44a or 44b, respectively. The output of the first and second domain (so1 and so2) are observed at the second latch, 54a or 54b, and the third multiplexor, 46a or 46b, respectively.

For cases Ib and IIb, the first multiplexor 42a receives the normal interface signal (di), the scan vector (si1), and the scan enable (Se1) for the first domain as inputs. If scan enable (Se1) for the first domain is not asserted, the normal interface signal (di)is selected and output. If scan enable (Se1) for the first domain is asserted, the scan vector (si1) for the first domain is selected and output instead.

The first latch 52a receives either the normal interface signal (di) or the scan vector (si1) for the first domain as input, depending whether the scan enable (Se1) for the first domain is asserted. It opens and outputs the received signal when the clock pulse is low. The first latch 52a is driven by inverted clock pulses.

The second multiplexor 44a receives either normal interface signal (di) or the scan vector (si1) for the first domain as one input, depending whether the scan enable (Se1) for the first domain are asserted, the scan vector (si2) for the second domain as the other input, and the scan mode (SM1) and scan enable (Se1) for the first domain as the selection input. If scan mode (SM1) for first domain is asserted and the scan enable (Se1) for the first domain is not asserted, the normal interface signal (di)is selected and output. If scan mode (SM1) for the first domain is asserted, the scan vector (si1) for the first domain is selected and output. If scan mode (SM1) for the first domain is not asserted, the scan vector (si2) for the second domain is selected and output.

The second latch 54a receives either the scan vector (si1) for the first domain, the normal interface signal (di), or the scan vector (si2) for the second domain as input, depending whether the scan mode (SM1) and scan enable (Se1) for the first domain are asserted or not. The second latch 54a opens and outputs its input when the clock pulse is high. The second latch is driven by regular clock pulses. As described earlier, if scan mode (SM1) is asserted for the first domain, the output (SO1) of the first domain may be observed here.

The third latch 56a receives either the scan vector (si1) for the first domain, the normal interface signal (di), or the scan vector (si2) for the second domain as input, depending whether the scan mode (SM1) and scan enable (Se1) for the first domain are asserted or not. The third latch 56a opens and outputs its input when the clock pulse is low. The third latch 56a is driven by inverted clock pulses.

The third multiplexor 46a receives either the normal interface signal (di) or the scan vector (si1) for the first domain as one input, depending whether the scan enable (Se1) for the first domain is asserted, the scan vector (si2) for the second domain as the other input, the scan mode (SM2) for the second domain as the selection input. If the scan mode (SM2) for the second domain is not asserted, the multiplexor 46a selects either the normal interface signal (di) or the scan vector (si1) for the first domain, and outputs it. If the scan mode (SM2) for the second domain is asserted, the multiplexor 46a selects the scan vector (si2) for the second domain and outputs it. As described earlier, the output (SO2) of the second domain may be observed here at the third multiplexor 46a.

Similarly, for cases IIIb and IVb, the first multiplexor 42b receives the normal interface signal (di), the scan vector (si1) and the scan enable (Se1) for the first domain as inputs. If scan enable (Se1) for the first domain is not asserted, the normal interface signal (di)is selected and output. If scan enable (Se1) for the first domain is asserted, the scan vector (si1) for the first domain is selected and output instead.

The first latch 52b receives either the normal interface signal (di) or the scan vector (si1) for the first domain as input, depending whether the scan enable (Se1) for the first domain is asserted. It opens and outputs the received signal when the clock pulse is high. The first latch 52b is driven by regular clock pulses.

The second multiplexor 44b receives either normal interface signal (di) or the scan vector (si1) for the first domain as one input, depending whether the scan enable (Seq) for the first domain is asserted, the scan vector (si2) for the second domain as the other input, and the scan mode (SM1) for the first domain as the selection input. If scan mode (SM1) and scan enable (Se1) for the first domain are asserted, the scan vector (si1) for the first domain is selected and output. If the scan mode (SM1) for first domain is asserted and the scan enable (Se1) for the first domain is not asserted, the normal interface signal (di) is selected and output. If scan mode (SM1) for the first domain is not asserted, the scan vector (si2) for the second domain is selected and output.

The second latch 54b receives either the scan vector (si1) for the first domain, the normal interface signal (di), or the scan vector (si2) for the second domain as input, depending whether the scan mode (SM1) and scan enable (Se1) for the first domain are asserted or not. The second latch 54b opens and outputs its input when the clock pulse is low. The second latch is driven by inverted clock pulses. As described earlier, if scan mode (SM1) is asserted for the first domain, the output (SO1) of the first domain may be observed here.

The third latch 56b receives either the scan vector (si1) for the first domain, the normal interface signal (di), or the scan vector (si2) for the second domain as input, depending whether the scan mode (SM1) and scan enable (Se1) for the first domain are asserted or not. The third latch 56b opens and outputs its input when the clock pulse is high. The third latch 56b is driven by regular clock pulses.

The third multiplexor 46b receives either the normal interface signal (di) or the scan vector (si1) for the first domain as one input, depending whether the scan enable (Se1) for the first domain is asserted, the scan vector (si2) for the second domain as the other input, and the scan mode (SM2) for the second domain as the selection input. If the scan mode (SM2) for the second domain is not asserted, the multiplexor 46b selects either the normal interface signal (di) or the scan vector (si1) for the first domain, and outputs it. If the scan mode (SM2) for the second domain is asserted, the multiplexor 46b selects the scan vector (si2) for the second domain and outputs it. As described earlier, the output (SO2) of the second domain may be observed here at the third multiplexor 46a.

The signal values described above for the various operating modes are summarized in the following table:

|  | OPERATION MODE | | |
| --- | --- | --- | --- |
|  | Functional | Domain 1 Scan | Domain 2 Scan |
| Se1 | 0 | 1 or 0 | 0 |
| SM1 | 0 | 1 | 0 |
| SM2 | 0 | 0 | 1 |
| SI1 | X | 1 or 0 | X |
| SI2 | X | X | 1 or 0 |
| SO1 | X | 1 or 0 | X |
| di | 1 or 0 | 1 or 0 | X |
| $q_o$(SO2) | 1 or 0 | X | 1 or 0 |

X = Don't care

Thus, the inter-domain latch of the present invention, 40a or 40b, establishes a controllable and observable boundary point for the two domains for cases Ib, IIb, IIIb and IVb. Additionally, the inter domain latch of the present invention, 40a or 40b, saves one flip-flop for each boundary point. Furthermore, the inter-domain latch of the present invention, 40a or 40b, being a direct replacement of the intervening latch of the two domains, provides a relatively easy to implement approach for establishing a controllable and observable boundary points between the two domains for these cases.

While the present invention has been described in terms of presently preferred and alternate embodiments, those skilled in the art will recognize that the invention is not limited to the embodiments described. The method and apparatus of the present invention can be practiced with modification and alteration within the spirit and scope of the appended claims. The description is thus to be regarded as illustrative instead of limiting on the present invention.

What is claimed is:

1. In a sequential logic design comprising a first and a second domain, each having an opposite edge clock for their flip-flops, an inter-domain latch for establishing a controllable and observable boundary point between said first and second domains, said interdomain latch comprising:

a) a first multiplexor having a normal interface signal as a first input of said first multiplexor, a first scan vector for said first domain as a second input of said first multiplexor, and a first scan enable indicator signal as a third input for said first multiplexor, said normal interface signal being an output of said first multiplexor when said first scan enable indicator signal is not asserted, said first scan vector being said output of said first multiplexor when said first scan enable indicator signal is asserted;

b) a first latch coupled to said first multiplexor and having the output from said first multiplexor as a first input of said first latch and a first clock signal as a second input of said first latch, said first input of said first latch being an output of said first latch when said first clock signal changes states;

c) a second multiplexor coupled to said first latch and having the output from said first latch as a first input of said second multiplexor, a second scan vector of said second domain as a second input of said second multiplexor and a first scan mode signal as a third input of said second multiplexor, said first input of said second multiplexor being an output of said second multiplexor when said first scan mode signal is asserted, said second scan vector for second domain being said output of said second multiplexor when said first scan mode signal is not asserted;

d) a second latch coupled to said second multiplexor and having the output from said second multiplexor as a first input of said second latch and a second clock signal as a second input of said second latch, said first input of said second latch being an output of said second latch when said second clock signal changes states;

e) a third latch coupled to said second latch and having the output from said second latch as a first input of said third latch and a third clock signal as a second input of said third latch, said first input of said third latch being an output of said third latch when said third clock signal changes states; and f) a third multiplexor coupled to said first and third latches and having the output from said first latch as a first input of said third multiplexor, the output from said third latch as a second input of said third multiplexor and a second scan mode signal as a third input of said third multiplexor, said second input of said third multiplexor being an output of said third multiplexor when said second scan mode signal is asserted, said first input of said third multiplexor being said output of said third multiplexor when said second scan mode signal is not asserted.

2. The inter-domain latch as set forth in claim 1, wherein, said first and second domains are rising edge and falling edge domains respectively;

said first input of said first latch being said output of said first latch when said first clock signal gas low;

said first input of said second latch being said output of said second latch when said second clock signal goes high;

said first input of said third latch being said output of said third latch when said third clock signal goes low:

said first and third clock signals being clock signals having the same frequency and duty cycle; and said second clock signal being an inverted clock signal of said first clock signal.

3. The inter-domain latch as set forth in claim 1, wherein, said first and second domains are falling edge and rising edge domains respectively;

said first input of said first latch being said output of said first latch when said first clock signal goes high;

said first input of said second latch being said output of said second latch when said second clock signal goes low;

said first input of said third latch being said output of said third latch when said third clock signal goes high;

said first and third clock signals being clock signals having the same frequency and duty cycle; and said second clock signal being an inverted clock signal of said first and third clock signals.

4. In a sequential logic design comprising a first and a second domain, each having an opposite edge clock for their flip-flops, a method for establishing a controllable and observable boundary point between said first and second domains, said method comprising the steps of:

a) receiving a normal interface signal, a first scan vector for said first domain, and a first scan enable indicator signal as inputs, outputting said normal interface signal when said first scan enable indicator signal is not asserted, and outputting said first scan vector for said first domain when said first scan enable indicator signal is asserted;

b) receiving a first clock signal and one of said normal interface signal and said first scan vector for said first domain as inputs, and outputting one of said normal interface signal and said first scan vector for said first domain when said first clock signal changes states;

c) receiving a second scan vector for said second domain, a first scan mode Z1, and one of said normal interface signal and said first scan vector for said first domain as inputs, outputting one of said normal interface signal and said first scan vector for said first domain when said first scan mode signal is asserted, and outputting said second scan vector for said second domain when said first scan mode signal is not asserted;

d) receiving a second clock signal and one of said normal interface signal, said first scan vector for said first domain and said second scan vector for said second domain as inputs, and outputting one of said normal interface signal, said first scan vector for said first domain, and said second scan vector for said second domain when said second clock signal changes states;

e) receiving a third clock signal and one of said normal interface signal, said first scan vector for said first domain and said second scan vector for said second domain as inputs, and outputting one of said normal interface signal, said first scan vector for said first domain, and said second scan vector for said second domain when said third clock signal changes states; and f) receiving a second scan mode signal, one of said normal interface signal and said first scan vector for said first domain, one of said first scan vector for said first domain and said second scan vector for said second domain as inputs, outputting said second scan vector for said second domain when said second scan mode signal is asserted, and outputting one of said normal interface signal and said first scan vector for said first domain when said second scan mode is not asserted.

5. The method as set forth in claim 4, wherein, said first and second domains are rising edge and falling edge domains respectively;

said first input of said first latch being said output of said first latch when said first clock signal goes low;

said first input of said second latch being said output of Said second latch when said second clock signal goes high;

said first input of said third latch being said output of said third latch when said third clock signal goes low;

said first and third clock signals being clock signals having the same frequency and duty cycle: and said second clock signal being an inverted clock signal of said first clock signal.

6. The method as set forth in claim 4, wherein, said first and second domains are falling edge and rising edge domains respectively;

said first input of said first latch being said output of said first latch when said first clock signal goes high;

said first input of said second latch being said output of said second latch when said second clock signal goes low;

said first input of said third latch being said output of said third latch when said third clock signal goes high;

said first and third clock signals being clock signals having the same frequency and duty cycle; and said second clock signal being an inverted clock signal of said first and third clock signals,

* * * * *

UNITED STATES PATENT AND TRADEMARK OFFICE
CERTIFICATE OF CORRECTION

PATENT NO. : 5,390,190
DATED : February 14, 1995
INVENTOR(S) : Nanda et al.

It is certified that error appears in the above-identified patent and that said Letters Patent is hereby corrected as shown below:

In column 8, claim 2 at line 6, please delete " gas " and insert -- goes --.

In column 8, claim 4 at line 53, please delete " Z1 " and insert --signal--.

Signed and Sealed this

Twenty-third Day of March, 1999

Attest:

Q. TODD DICKINSON

Attesting Officer

Acting Commissioner of Patents and Trademarks